(12) United States Patent
Kern et al.

(10) Patent No.: US 12,340,843 B2
(45) Date of Patent: Jun. 24, 2025

(54) MEMORY DEVICE AND METHOD FOR TESTING THE MEMORY DEVICE THAT BYPASSES MEMORY CELLS

(71) Applicant: Infineon Technologies AG, Neubiberg (DE)

(72) Inventors: Thomas Kern, Aschheim (DE); Sebastian Kiesel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 152 days.

(21) Appl. No.: 18/171,426

(22) Filed: Feb. 20, 2023

(65) Prior Publication Data

US 2023/0267999 A1 Aug. 24, 2023

(30) Foreign Application Priority Data

Feb. 23, 2022 (DE) ...................... 10 2022 104 242.1

(51) Int. Cl.
*G11C 13/00* (2006.01)
*G11C 29/38* (2006.01)

(52) U.S. Cl.
CPC ........ *G11C 13/0064* (2013.01); *G11C 13/004* (2013.01); *G11C 13/0069* (2013.01); *G11C 29/38* (2013.01)

(58) Field of Classification Search
None
See application file for complete search history.

(56) References Cited

U.S. PATENT DOCUMENTS

| | | | | | |
|---|---|---|---|---|---|
| 4,878,220 | A | * | 10/1989 | Hashimoto | ......... G06F 11/2215 714/733 |
| 5,287,326 | A | * | 2/1994 | Hirata | ................ G11C 16/3459 365/201 |
| 5,371,708 | A | * | 12/1994 | Kobayashi | ........... G11C 29/003 365/230.01 |
| 5,592,425 | A | * | 1/1997 | Neduva | .................. G11C 29/12 714/719 |
| 9,805,771 | B2 | | 10/2017 | Loibl et al. | |
| 2002/0172068 | A1 | * | 11/2002 | Hidaka | ................... G11C 11/15 365/100 |
| 2003/0053471 | A1 | | 3/2003 | Stief | |

FOREIGN PATENT DOCUMENTS

DE 10146149 A1 4/2003

* cited by examiner

*Primary Examiner* — J. H. Hur
(74) *Attorney, Agent, or Firm* — Eschweiler & Potashnik, LLC

(57) ABSTRACT

A memory device is provided. The memory device comprises at least one non-volatile memory cell, a write circuit configured to write to the at least one memory cell, and a read circuit configured to read from the at least one memory cell, wherein the memory device is configured to be operable in a test operating mode, in which at least one test path can be tested, and wherein the test path comprises at least a portion of the write circuit and at least a portion of the read circuit, and bypasses the at least one memory cell.

14 Claims, 6 Drawing Sheets

MEMORY DEVICE AND METHOD FOR TESTING THE MEMORY DEVICE THAT BYPASSES MEMORY CELLS

REFERENCE TO RELATED APPLICATIONS

This application claims priority to German Patent Application 10 2022 104 242.1, filed on Feb. 23, 2022. The contents of the above-referenced Patent Application is hereby incorporated by reference in its entirety.

TECHNICAL FIELD

The invention relates to a memory device and to a method for operating a memory device.

SUMMARY

Memory devices, for instance those containing non-volatile memory cells, typically undergo tests before being shipped.

The memory device can comprise an analog hard-macro portion, which can comprise the memory cells themselves, write and read circuits, controllers, pumps, switches, configurable hardware evaluation logic, etc., and a digital interface portion, which can comprise logic chips, for example.

The digital interface portion is typically tested by means of scan chains.

In contrast, the analog hard-macro portion is typically tested only in terms of its basic functions, for instance whether forming/set/reset and read are working for the memory cells.

It may be necessary, however, also to test peripheral components of the analog hard-macro portion, for instance individually and/or in interaction with each other. For example, such tests should provide information about read performance/read speed, driver strengths of controllers/pumps, and whether, for instance, there are process-related defects present (e.g. in transistors).

DETAILED DESCRIPTION

Typical memory devices currently contain several hundred write buffers and several hundred sense amplifiers. These occupy a large proportion of the semiconductor surface area of the memory device, so for this reason alone there is a high probability that faults might be present there.

Even if it were possible in principle to read out the write buffers, for example, this would require additional lines (and possibly also additional capacitors), which would be complicated and expensive.

Various exemplary embodiments provide a memory device and a method for operating the same, which make it possible to test the memory device, for example in particular peripheral hard-macro components.

For the memory device, in a test operating mode, both a read circuit and a write circuit (or portions of each) are used to test the memory device while bypassing the memory cell itself.

The memory device can comprise a bypass, which connects the read circuit, for instance a read line (also known as a sense line), e.g. a read data bus, directly to the write circuit, for instance a write line, e.g. a write data bus.

In the test operating mode, the memory device can be supplied with test stimuli, for instance by means of the read line, which can be used to test evaluation logic (for example what is known as "catch logic", which is explained in greater detail below).

For testing, it is not necessary actually to write to the memory cell in order to test the logic in the hard macro, which is advantageous to the operating life of the memory device.

According to various exemplary embodiments, re-utilizing existing structures for the test operating mode makes it possible to achieve a comprehensive improvement in the test capabilities with minimum (e.g. design) effort.

In other words, the write circuit and the read circuit can be used to test each other.

This makes it possible to emulate cell currents with minimum expenditure of analog resources.

In addition, all states can be stimulated with minimum overhead, for instance states that are used in a coding technique in which, for a group of memory cells, those memory cells are determined that are in a first memory state (which memory cells are of known number, for example half the number of memory cells in the group), and a second memory state is assigned to the remaining memory cells.

In a memory device, a test of components is made possible in which although a memory-cell array is used, the memory cells themselves are bypassed (switched to inactive), and essentially only the peripheral read/write circuits (or read/write components) are part of the test path and therefore actively being used, so that the write circuit is verified by the read circuit.

In various exemplary embodiments, a memory device is provided which comprises at least one non-volatile memory cell, a write circuit designed to write to the at least one memory cell, and a read circuit designed to read from the at least one memory cell, wherein the memory device is designed to be operable in a test operating mode, in which at least one test path can be tested, and wherein the test path comprises at least a portion of the write circuit and at least a portion of the read circuit, and bypasses the at least one memory cell.

BRIEF DESCRIPTION OF THE DRAWINGS

Exemplary embodiments of the invention are described in more detail below and are shown in the figures, in which.

DESCRIPTION

In the following detailed description, reference is made to the accompanying drawings, which form part of this description and which show for the purpose of illustration, specific embodiments in which the invention can be applied. In this regard, direction terminology such as "above", "below", "in front", "behind", "front", "rear", etc. is used with reference to the orientation in the figure(s) described.

Since components of embodiments can be positioned in a number of different orientations, the direction terminology is used for the purpose of illustration and has no limiting effect whatsoever. Obviously, other embodiments can be used and structural or logical modifications can be made without departing from the scope of protection of the present invention. Of course the features of the various exemplary embodiments described here can be combined with one another unless specifically stated otherwise. Therefore the following detailed description shall not be interpreted in any limiting sense, and the scope of protection of the present invention is defined by the accompanying claims.

In this description, the terms "connected", "attached" and "coupled" are used to describe both a direct and an indirect connection, a direct or indirect attachment, and a direct or indirect coupling. In the figures, identical or similar elements are denoted by the same reference signs where this is expedient.

Figure 1:
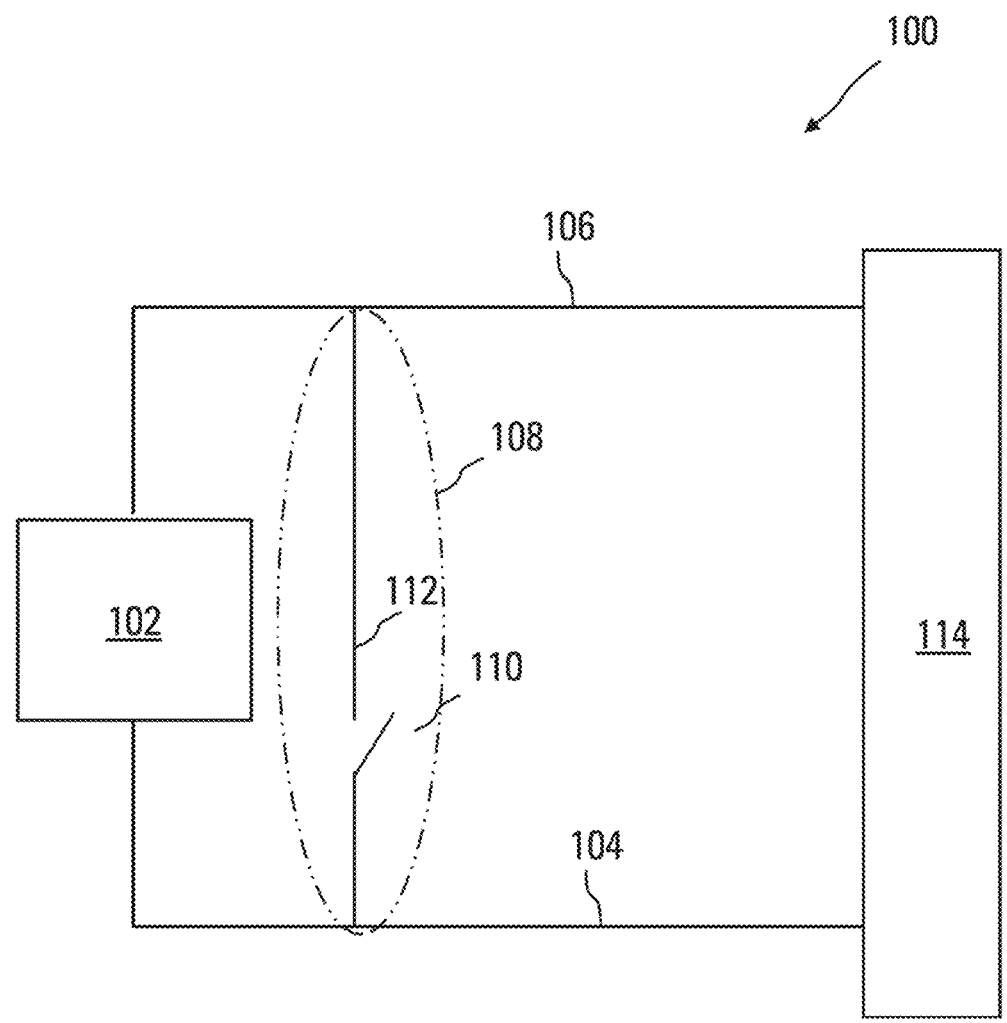
FIG. 1 shows a schematic diagram of a memory device according to various exemplary embodiments.
Figure 2:
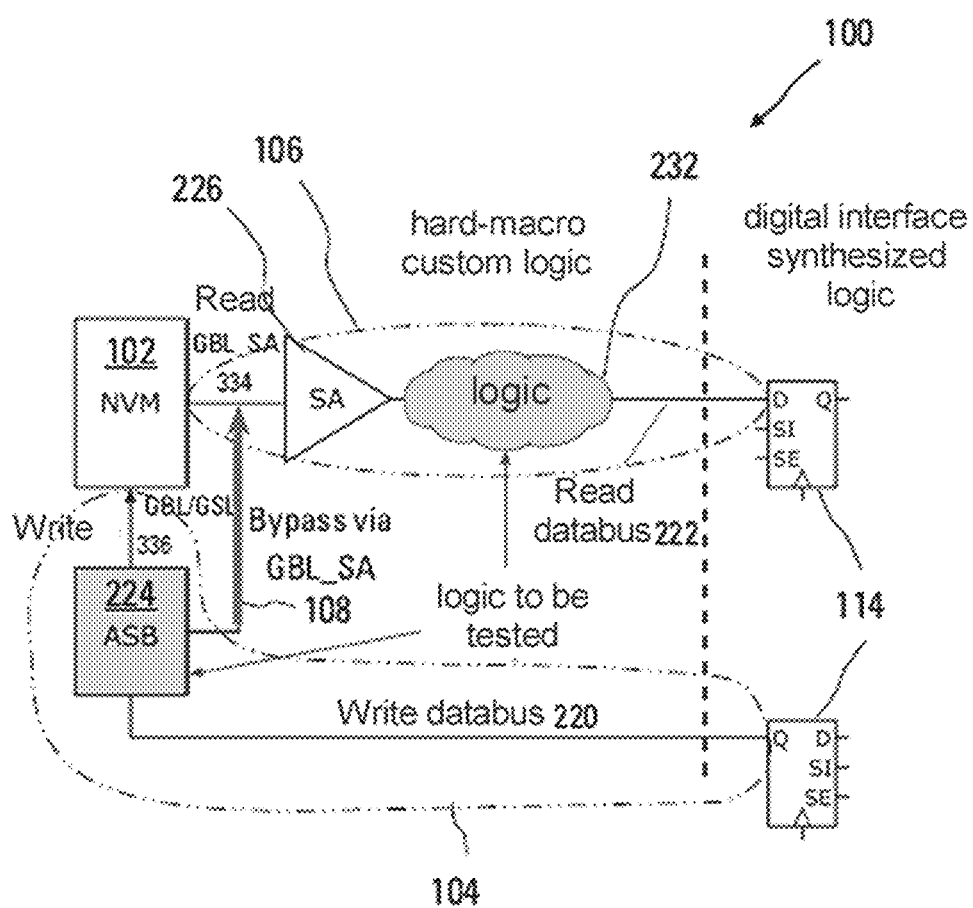
FIG. 2 shows a schematic diagram of a memory device according to various exemplary embodiments.

FIG. 1 and FIG. 2 each show a schematic diagram of a memory device 100 according to various exemplary embodiments.

The memory device 100 comprises at least one non-volatile memory cell 102.

The memory device 100 can comprise a plurality of non-volatile memory cells 102, for instance hundreds, thousands or more. In the figures (except for FIG. 4), exemplary embodiments are illustrated using individual memory cells 102. The explanations for the individual memory cell 102 apply analogously to the plurality of non-volatile memory cells.

The at least one non-volatile memory cell 102 can be, for example, a resistive random access memory (RRAM) memory cell, a phase-change random access memory (PCRAM) memory cell, or a magneto-resistive random access memory (MRAM), where the aforementioned memory cells are resistive memory cells 102, or a FLASH memory cell, for example.

The memory device 100 comprises a write circuit 104 designed to write to the at least one memory cell 102.

The memory device 100 further comprises a read circuit 106 designed to read from the at least one memory cell 102.

The memory device 100 can be designed to be operable in what is known as a normal operating mode. In the normal operating mode (e.g. in a write mode), data values can be written to the non-volatile memory cell 102 by means of the write circuit 104, or (e.g. in a read mode) a data value stored in the non-volatile memory cell 102 can be read by means of the read circuit 106. In the normal operating mode, the read mode and the write mode can alternate with one another.

The memory device 100 is further designed to be operable in a test operating mode. In the test operating mode, it can be ascertained whether (test) data received by the memory device 100 is transferred and/or processed as intended, or whether errors are occurring in the transfer and/or processing.

In the test operating mode, at least one test path can be tested, wherein the test path comprises at least a portion of the write circuit 104 and at least a portion of the read circuit 106, and bypasses the at least one memory cell 102.

In the test operating mode, the portion of the write circuit 104 can be connected directly to the portion of the read circuit 106.

The (e.g. direct) connection of the write circuit 104 to the read circuit 106 in the test operating mode makes it possible to test the memory device 100 while bypassing the memory cell 102. In particular, the write circuit 104 and the read circuit 106 are tested here, or in other words, the write circuit 104 and the read circuit 106 test each other.

One aspect of mainly using existing structures for the test operating mode is that both the read circuit 106 and the write circuit 104, as functional elements for the normal operating mode, shall be tested as comprehensively as possible.

Another aspect of mainly using existing structures for the test operating mode is that this saves space and costs.

One aspect of omitting the memory cell 102 is that (possibly repeated) writing to the memory cell 102 in the test operating mode could adversely affect the operating life of the memory cell 102.

Detailed aspects of the exemplary embodiments from FIG. 1 and FIG. 2 are explained below.

In various exemplary embodiments, the write circuit 104 can comprise a buffer memory 224, in which at least one data value can be buffered before the data value is written to memory cells 102 of the non-volatile data memory 100.

The buffer memory 224 is also known as a write buffer or an assembly buffer (ASB). The buffer memory 224 can be provided with the at least one data value by means of an input line 220.

The write circuit 104 can further comprise a first write line 220 (e.g. as a write data bus, which connects a memory controller 114, for instance a digital interface, to the buffer memory 224), and at least one second write line 336, for instance in the form of a global bit line or global source line (GBL, GSL), which can connect the buffer memory 224 to the memory cell 102. In a situation in which the buffer memory 224 is not provided, the memory controller 114 can be connected directly, for example, to the memory cell 102.

The read circuit 106 can comprise a sense amplifier 226 (SA).

The read circuit 106 can further comprise a first read line 334, which connects (for instance as a global bit line to the sense amplifier, GBL_SA) the memory cell 102 to the sense amplifier 226. The read circuit 106 can further comprise an evaluation circuit 232 (logic circuit), which can be custom-designed and can be connected to an output of the read circuit 106. The read circuit 106 can further comprise a second read line 222, which connects (for instance as a read data bus) the logic circuit 106 to the memory controller 114.

In the exemplary embodiment of the memory device 100 shown in FIG. 2, the write buffer 224, in the test operating mode, is connected to the first read line 334 (the GBL_SA).

In general, however, other elements or points along the read circuit 106 or the write circuit 104 can be connected to one another in the test operating mode. For example, it is not necessary for the memory device 100 to comprise the write buffer 224 at all. In this case, the write line 220 can be connected directly, for example, to the first read line 334.

In various exemplary embodiments, the evaluation logic can be located entirely in the memory controller 114, and therefore the read circuit 106 can have, for example, a direct connection between an output of the sense amplifier 226 and the memory controller 114.

In various exemplary embodiments, it can be desirable to design a bypass 108 of the memory cell 102 to be as near as possible to the memory cell 102 so that the test thereby includes a large number of circuit elements and circuit segments.

Figure 3:
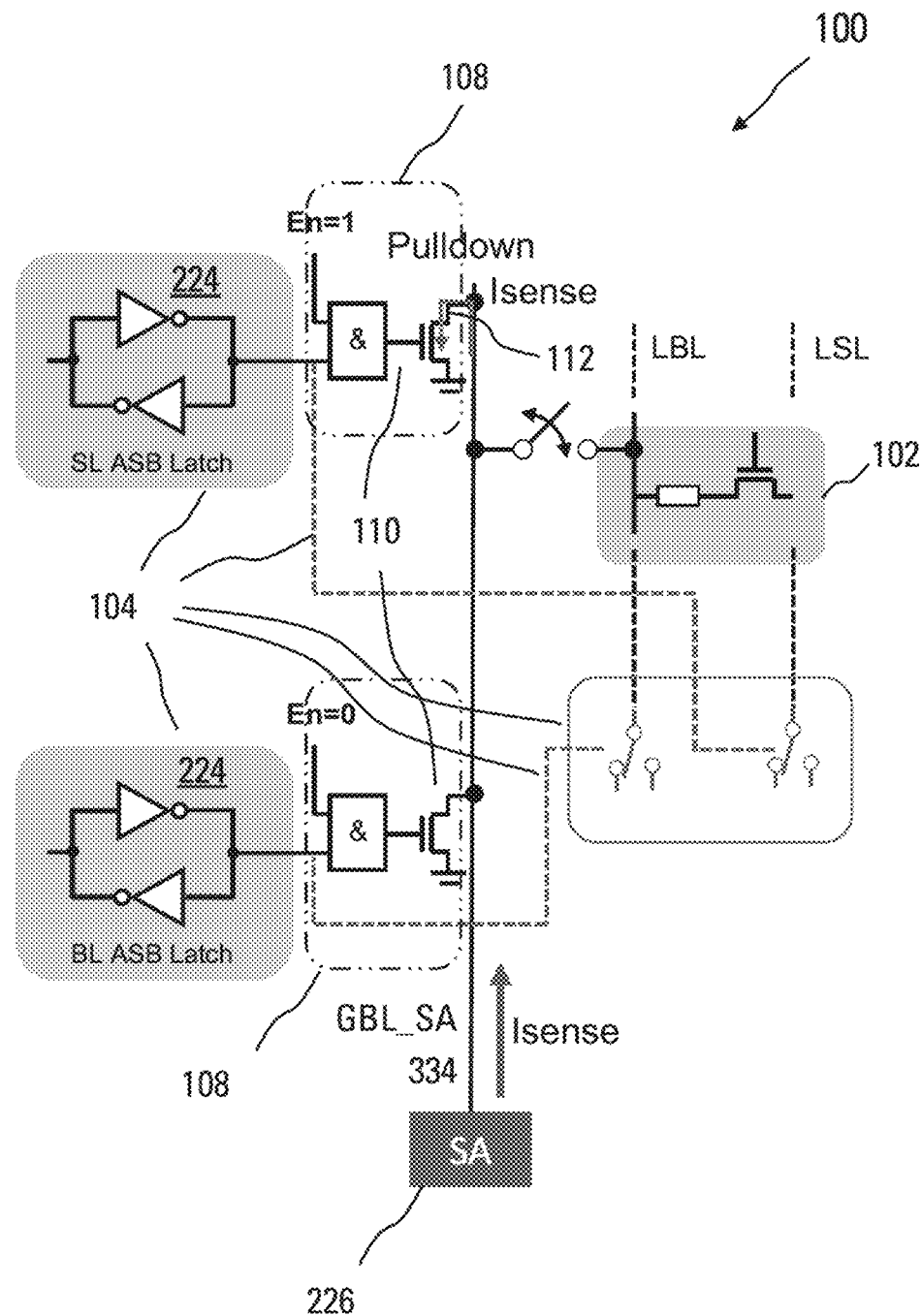
FIG. 3 shows a schematic diagram of a memory device according to various exemplary embodiments.

FIG. 3 shows a schematic detailed view of a memory device 100 according to various exemplary embodiments.

For example, the buffer memory 224 can comprise two latches, for instance one for a bit line BL (at the bottom in FIG. 3), and one for a source line (at the top in FIG. 3).

FIG. 3 shows a schematic detailed view of a memory device 100 according to various exemplary embodiments.

Elements of the memory device 100 can be similar or identical to those of the memory device 100 from FIG. 1 and/or FIG. 2. It may be the case that these are not described again.

FIG. 3 shows in particular how the connection between the read circuit 106 and the write circuit 104 can be provided in the test operating mode.

The memory device 100 can comprise a first switch 110 (or one per memory cell 102), which can be switched between a test operating-mode configuration and a normal operating-mode configuration. In the test operating-mode configuration, the switch 110 can connect the portion of the write circuit 104 to the portion of the read circuit 106, and in the normal operating mode, can disconnect the portion of the write circuit 104 from the portion of the read circuit 106.

For example, the first switch 110 can comprise at least one (pull-down) transistor 112.

In various exemplary embodiments, the first switch 110 (e.g. the pull-down transistor 112) can be controlled by means of the write buffer 224.

For example, a logic "1" at an output of the buffer memory 224 can take the read current high (which in an example case results in a resistance of <1 kΩ and is interpreted as a low resistance state (LRS), because the threshold therefor lies at about 5 kΩ, for example, and thus the resistance obtained lies significantly below this threshold).

A logic "0" at the output of the buffer memory 224 can take the read current Isense low, and accordingly set the resistance high (>1 MΩ), which is interpreted as a high resistance state (HRS), because the limit value of ~15 kΩ is exceeded.

It can hence be made possible to read out the contents of the write buffer 224 quickly using minimum additional resources (only the first switch 110) and with a negligible increase in the space required.

Figure 5:
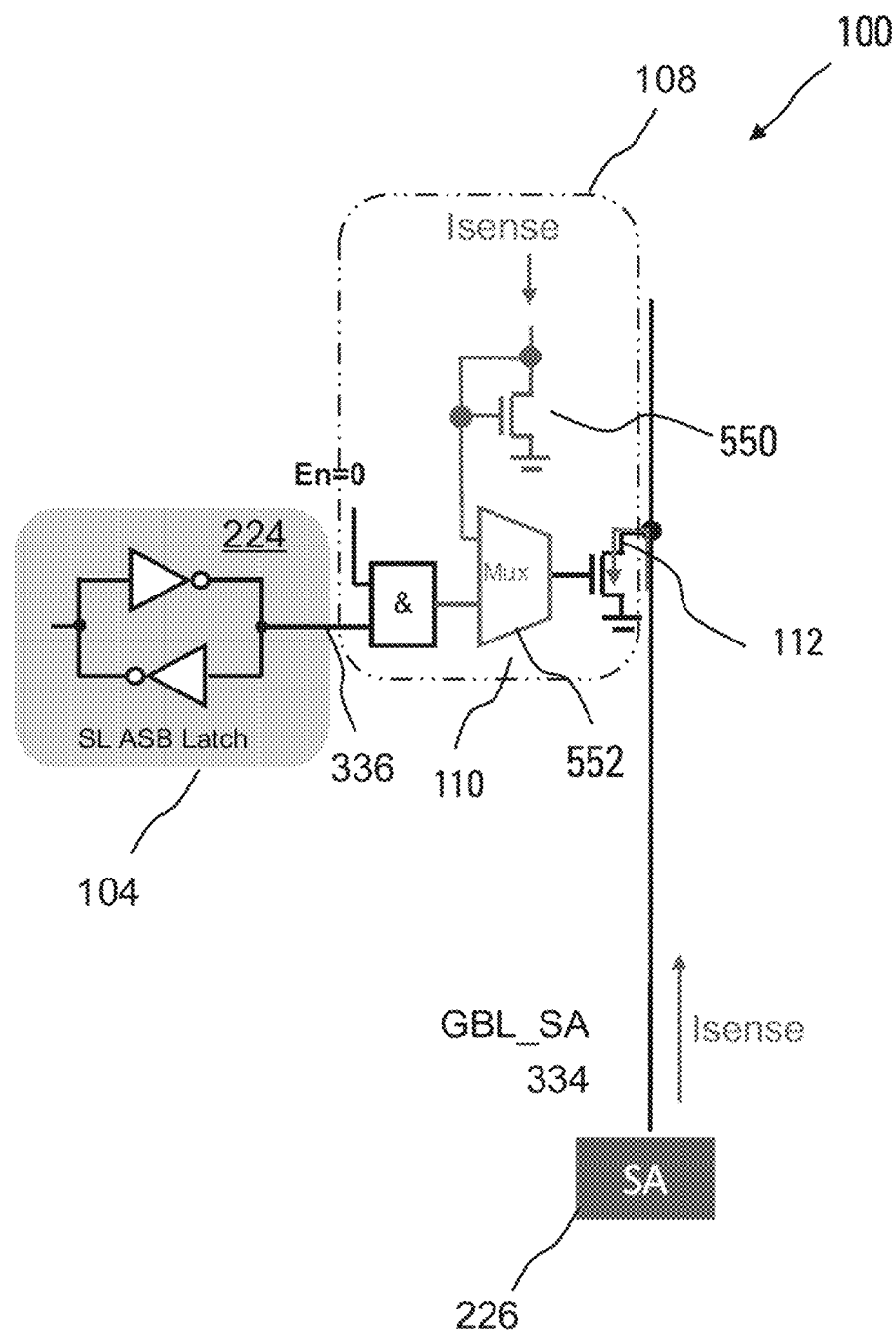
FIG. 5 shows a schematic detailed view of a memory device according to various exemplary embodiments.

FIG. 5 shows a schematic detailed view of a memory device 100 according to various exemplary embodiments.

The memory device 100 from FIG. 5 can comprise elements that are similar or identical to those of the memory devices from FIG. 1, FIG. 2 and/or in particular FIG. 3. It may be the case that these are not described again.

In various exemplary embodiments, the switch 110 can be provided as a current-controlled current sink, for example as a (e.g. pull-down NMOS) transistor, which can be controlled by an additional transistor 550 (if applicable by means of a multiplexer 552). This can make it possible to simulate cell currents and thereby provide a high-speed capability to provide over the full bandwidth of possible cell currents a high-speed test and analysis capability for the read circuit 106.

Although the test capability provided by the memory device 100 is advantageous for every type of evaluation logic, it can be particularly suitable for evaluation logic in which, based on probability considerations, a plurality of memory cells 102 are coded and evaluated jointly.

Figure 4:
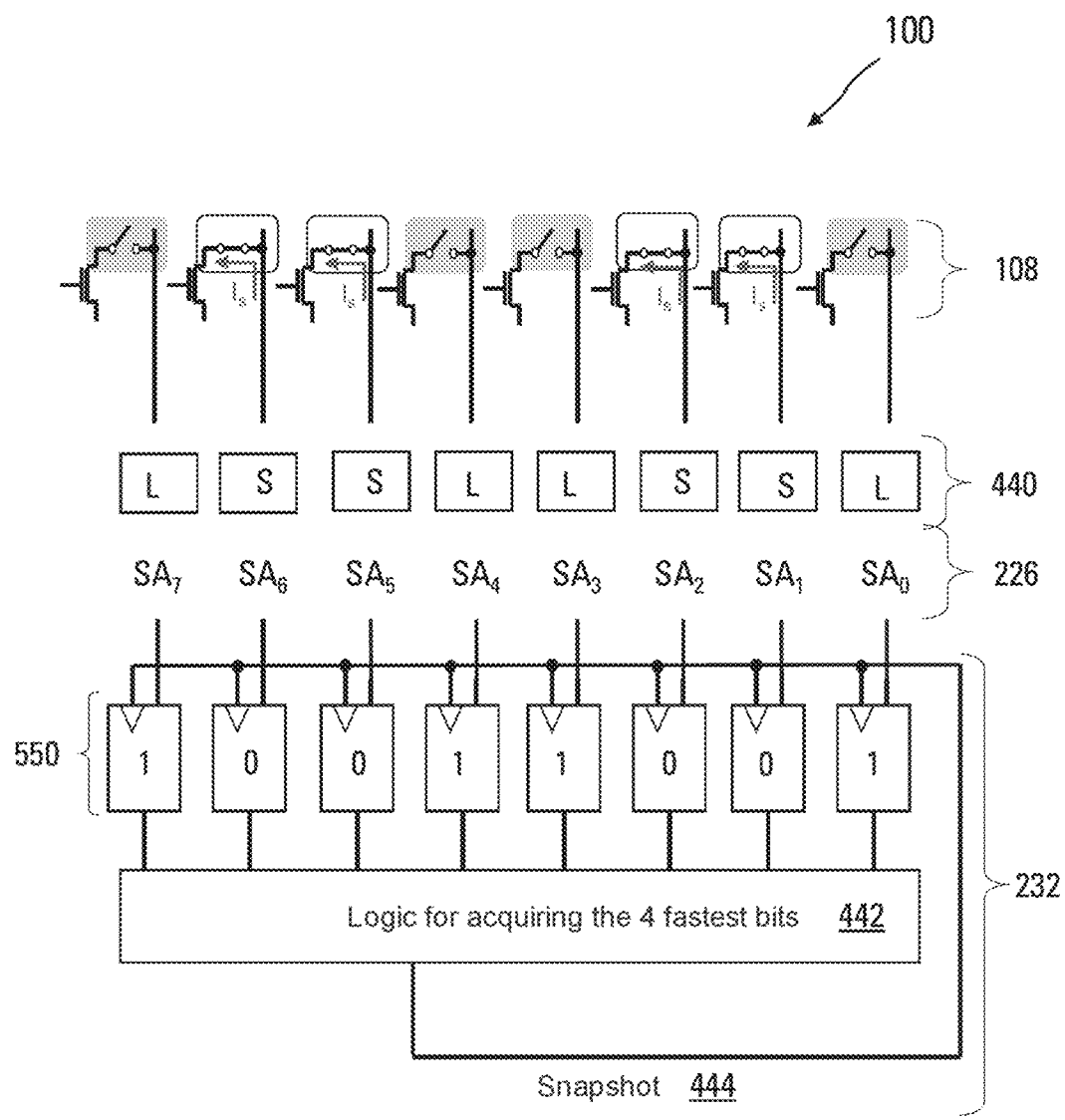
FIG. 4 shows a schematic detailed view of a memory device according to various exemplary embodiments.

FIG. 4 illustrates a corresponding exemplary embodiment using 4/8 coding, which is intended to be representative of comparable readout procedures. 4/8 coding means that a total of eight memory cells are always evaluated jointly, with four of the memory cells 102 always being programmed to a first state (e.g. "0"), and the other four to a second state (e.g. "1"). An output value is assigned to each of the outcomes that can be produced thereby.

This type of memory usage and/or evaluation can be tested in various exemplary embodiments.

In various exemplary embodiments, the sense amplifier 226 can further be designed to shift the read process into a time domain. This is explained in greater detail below in connection with the 4/8 coding, even though the 4/8 coding does not necessarily require a read process in the time domain.

The at least one buffer memory 224 can be designed, in the test operating mode, to buffer a data value (corresponding to e.g. "1" or "0"), and to control according to the buffered data value an electrical signal provided at the sense-amplifier input.

The at least one sense amplifier 226 (e.g. one per memory cell 102) can be designed to convert the electrical signal received at the sense-amplifier input into a corresponding time signal by switching over the output value from a first value to a second value when an integrated value of the electrical signal reaches a predefined threshold value.

The memory device 100 can further comprise, as part of the read circuit 106, an evaluation circuit 232. The evaluation circuit 232 can be designed to determine at least one logic value based on the signal provided at the sense-amplifier output.

The at least one buffer memory 224 can comprise a plurality of buffer memories (e.g. one per memory cell), wherein in a predefined first number (which is four in the example of FIG. 4) of the plurality of buffer memories 224 is stored a first data value, and in a predefined second number (likewise four in this case) of the plurality of buffer memories 224 is stored a second data value, wherein the at least one sense amplifier 226 comprises a plurality of sense amplifiers 226, wherein the evaluation circuit 232 is further designed to determine the first number of the plurality of buffer memories 224 based on their being the first for which the output value is switched over to the second value, and to identify the buffer memories having the output values that have not yet switched over as belonging to the second number.

In the example from FIG. 4, this means that the sense amplifiers 226 which are integrating/switching over at a swift rate (labelled S in 440) as a result of their data value (simulating a memory-cell value) stored in the buffer memory 224 get assigned the value "0", and the low-rate (L in 440) get assigned the value "1".

As soon as the fastest four bits are acquired by means of logic 442 designed for the purpose, this is fixed in a "snapshot" 444 and evaluated based on the coding, i.e. assigned a corresponding logic value.

The simulation of the memory-cell values can be performed here as described above by controlling the switch 110 by means of the buffer memory 224.

Figure 6:
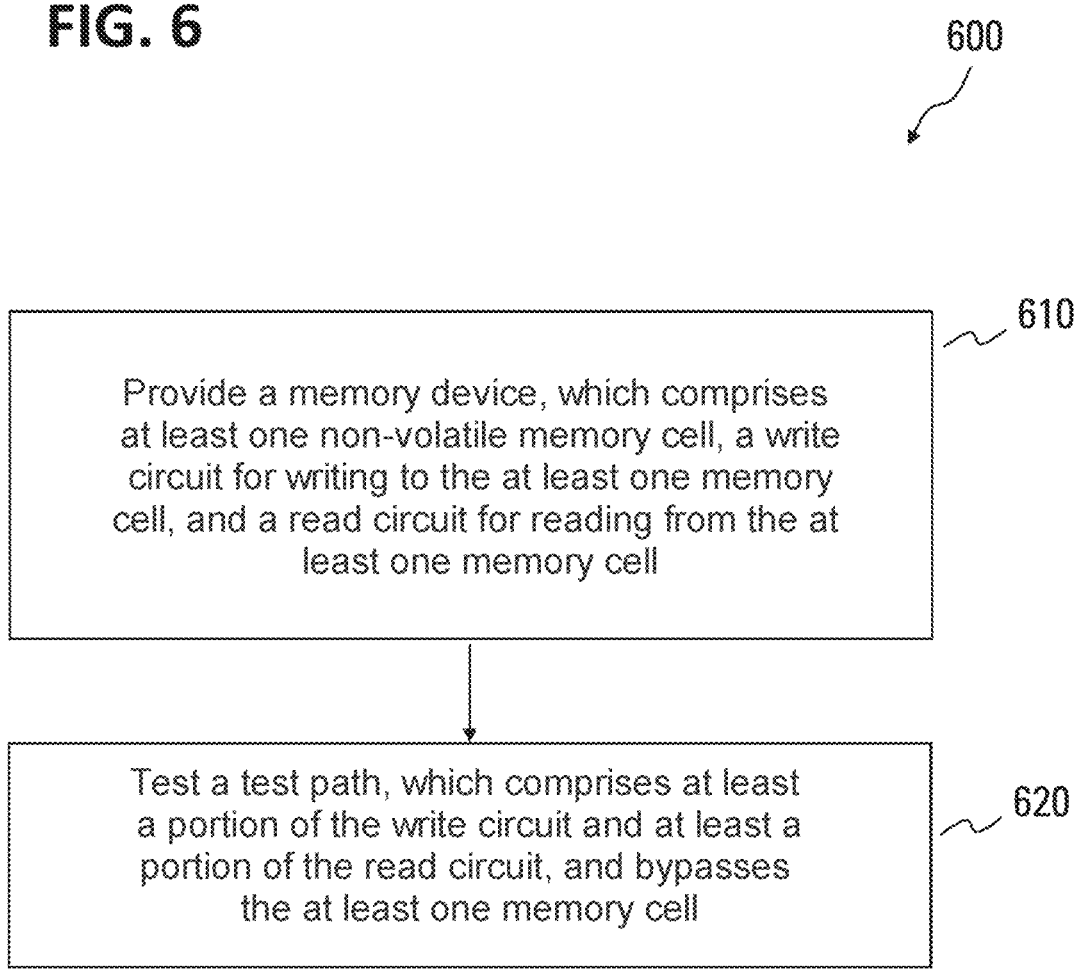
FIG. 6 shows a flow diagram of a method for operating a memory device according to various exemplary embodiments.

FIG. 6 shows a flow diagram 600 of a method for operating a memory device according to various exemplary embodiments.

The method comprises providing a memory device, which comprises at least one non-volatile memory cell, a write circuit for writing to the at least one memory cell, and a read circuit for reading from the at least one memory cell (610), and testing a test path, which comprises at least a portion of the write circuit and at least a portion of the read circuit, and bypasses the at least one memory cell (620).

Some exemplary embodiments are given below in summary.

Exemplary embodiment 1 is a memory device, which comprises at least one non-volatile memory cell, a write circuit designed to write to the at least one memory cell, and a read circuit designed to read from the at least one memory cell, wherein the memory device is designed to be operable in a test operating mode, in which at least one test path can be tested, and wherein the test path comprises at least a portion of the write circuit and at least a portion of the read circuit, and bypasses the at least one memory cell.

Exemplary embodiment 2 is a memory device according to exemplary embodiment 1, wherein in the test operating mode, the portion of the write circuit is connected directly to the portion of the read circuit.

Exemplary embodiment 3 is a memory device according to exemplary embodiment 1 or 2, further comprising for each of the at least one memory cells a first switch, which can be switched between a test operating-mode configuration and a normal operating-mode configuration, wherein in the test operating-mode configuration, the switch connects the portion of the write circuit to the portion of the read circuit, and in the normal operating, mode disconnects the portion of the write circuit from the portion of the read circuit.

Exemplary embodiment 4 is a memory device according to exemplary embodiment 3, wherein the switch comprises a transistor.

Exemplary embodiment 5 is a memory device according to one of exemplary embodiments 1 to 4, further comprising for each of the at least one memory cells a second switch, which is designed selectively to disconnect the at least one memory cell from the write circuit and/or from the read circuit for the test operating mode, or to connect same to the write circuit and/or to the read circuit.

Exemplary embodiment 6 is a memory device according to one of exemplary embodiments 1 to 5, further comprising at least one buffer memory, which is designed to buffer a data value for storing in the at least one non-volatile memory cell.

Exemplary embodiment 7 is a memory device according to one of exemplary embodiments 1 to 6, further comprising at least one sense amplifier, which can be connected to the at least one memory cell, and is designed to determine an output value based on an electrical signal received at a sense-amplifier input, and to provide said output value at a sense-amplifier output.

Exemplary embodiment 8 is a memory device according to exemplary embodiments 6 and 7, wherein the at least one buffer memory is coupled to the at least one sense amplifier.

Exemplary embodiment 9 is a memory device according to exemplary embodiments 6 and 7, wherein the at least one buffer memory is further designed, in the test operating mode, to buffer a data value, and to control according to the buffered data value an electrical signal provided at the sense-amplifier input.

Exemplary embodiment 10 is a memory device according to one of exemplary embodiments 7 to 9, wherein the at least one sense amplifier is designed to convert the electrical signal received at the sense-amplifier input into a corresponding time signal by switching over the output value from a first value to a second value when an integrated value of the electrical signal reaches a predefined threshold value.

Exemplary embodiment 11 is a memory device according to one of exemplary embodiments 7 to 10, further comprising an evaluation circuit, which is designed to determine at least one logic value based on the signal provided at the sense-amplifier output.

Exemplary embodiment 12 is a memory device according to exemplary embodiments 6 and 7, wherein the at least one buffer memory comprises a plurality of buffer memories, wherein in a predefined first number of the plurality of buffer memories is stored a first data value, and in a predefined second number of the plurality of buffer memories is stored a second data value, wherein the at least one sense amplifier comprises a plurality of sense amplifiers, wherein the evaluation circuit is further designed to determine the first number of the plurality of buffer memories based on their being the first for which the output value is switched over to the second value, and to identify the buffer memories having the output values that have not yet switched over as belonging to the second number.

Exemplary embodiment 13 is a memory device according to exemplary embodiment 12, wherein the at least one logic value comprises a plurality of different logic values, and wherein the evaluation circuit is further designed to assign one of the plurality of different logic values to each possible combination of the first number of second values and the second number of first values.

Exemplary embodiment 14 is a memory device according to one of exemplary embodiments 1 to 13, wherein the at least one non-volatile memory cell is a resistive memory cell.

Exemplary embodiment 15 is a memory device according to one of exemplary embodiments 1 to 14, wherein the at least one non-volatile memory cell comprises, or consists of, one from the following group: RRAM, PCRAM, MRAM and FLASH.

Exemplary embodiment 16 is a memory device according to exemplary embodiment 3 or 4, wherein the switch is provided as a current-controlled current sink, and wherein the switch optionally comprises an additional transistor, which is designed to facilitate the current control of the current sink.

Exemplary embodiment 17 is a method for operating a memory device, which comprises at least one non-volatile memory cell, a write circuit for writing to the at least one memory cell, and a read circuit for reading from the at least one memory cell, said method comprising: testing a test path, which comprises at least a portion of the write circuit and at least a portion of the read circuit, and bypasses the at least one memory cell.

Exemplary embodiment 18 is a method according to exemplary embodiment 17, wherein in the test operating mode, the portion of the write circuit is connected directly to the portion of the read circuit.

Exemplary embodiment 19 is a method according to exemplary embodiment 17 or 18, further comprising: switching between a test operating-mode configuration and a normal operating-mode configuration, wherein in the test operating-mode configuration, the portion of the write circuit is connected to the portion of the read circuit, and in normal operating mode, the portion of the write circuit is disconnected from the portion of the read circuit.

Exemplary embodiment 20 is a method according to exemplary embodiment 19, wherein the switching comprises controlling a transistor.

Exemplary embodiment 21 is a method according to one of exemplary embodiments 17 to 20, further comprising: selectively disconnecting the at least one non-volatile memory cell from the write circuit and/or from the read circuit for the test operating mode, or connecting the at least one non-volatile memory cell to the write circuit and/or to the read circuit.

Exemplary embodiment 22 is a method according to one of exemplary embodiments 17 to 21, wherein the memory device further comprises at least one buffer memory, said method comprising: buffering a data value for storing in the at least one non-volatile memory cell.

Exemplary embodiment 23 is a method according to one of exemplary embodiments 17 to 22, wherein the memory device further comprises at least one sense amplifier, which can be connected to the at least one memory cell, said method comprising: determining an output value based on an electrical signal received at the sense-amplifier input, and providing said output value at a sense-amplifier output.

Exemplary embodiment 24 is a method according to exemplary embodiments 22 and 23, wherein the at least one buffer memory is coupled to the at least one sense am plifier.

Exemplary embodiment 25 is a method according to exemplary embodiment 22 or 23, further comprising: in the test operating mode, buffering a data value in the at least one buffer memory, and controlling according to the buffered data value an electrical signal provided at the sense-amplifier input.

Exemplary embodiment 26 is a method according to one of exemplary embodiments 23 to 25, further comprising: converting the electrical signal received at the sense-amplifier input into a corresponding time signal by switching over the output value from a first value to a second value when an integrated value of the electrical signal reaches a predefined threshold value.

Exemplary embodiment 27 is a method according to exemplary embodiment 25 or 26, further comprising: determining at least one logic value based on the signal provided at the sense-amplifier output.

Exemplary embodiment 28 is a method according to exemplary embodiments 22 and 23, wherein the at least one buffer memory comprises a plurality of buffer memories, wherein in a predefined first number of the plurality of buffer memories is stored a first data value, and in a predefined second number of the plurality of buffer memories is stored a second data value, and wherein the at least one sense amplifier comprises a plurality of sense amplifiers, said method further comprising: determining the first number of the plurality of buffer memories based on their being the first for which the output value is switched over to the second value, and identifying the buffer memories having the output values that have not yet switched over as belonging to the second num ber.

Exemplary embodiment 29 is a method according to exemplary embodiment 28, wherein the at least one logic value comprises a plurality of different logic values, the method further comprising: assigning one logic value of the plurality of different logic values to each possible combination of the first number of second values and the second number of first values.

Exemplary embodiment 30 is a method according to one of exemplary embodiments 17 to 29, wherein the at least one non-volatile memory cell is a resistive memory cell.

Exemplary embodiment 31 is a method according to one of exemplary embodiments 17 to 30, wherein the at least one non-volatile memory cell comprises, or consists of, one from the following group: RRAM, PCRAM, MRAM and FLASH.

Exemplary embodiment 32 is a method according to exemplary embodiment 19 or 20, wherein the switching comprises current-control of a current sink, and wherein the switching optionally comprises switching an additional transistor, which is designed to facilitate the current control of the current sink.

The description of the method provides further advantageous embodiments of the device, and vice versa.

What is claimed is:

1. A memory device, comprising:
   at least one non-volatile memory cell;
   a write circuit configured to write to the at least one non-volatile memory cell;
   a read circuit configured to read from the at least one non-volatile memory cell;
   wherein the memory device is configured to be operable in a test operating mode, in which at least one test path can be tested, and
   wherein the at least one test path comprises at least a portion of the write circuit and at least a portion of the read circuit, and bypasses the at least one non-volatile memory cell;
   for each of the at least one non-volatile memory cell a first switch, which can be switched between a test operating-mode configuration and a normal operating-mode configuration, wherein in the test operating-mode configuration, the first switch connects the portion of the write circuit to the portion of the read circuit, and in the normal operating mode, disconnects the portion of the write circuit from the portion of the read circuit; and
   wherein the first switch is provided as a current-controlled current sink, and wherein the first switch comprises an additional transistor, which is configured to facilitate current control of the current-controlled current sink.

2. The memory device as claimed in claim 1,
   wherein in the test operating mode, the portion of the write circuit is connected directly to the portion of the read circuit.

3. The memory device as claimed in claim 1,
   wherein the first switch comprises a transistor.

4. The memory device as claimed in claim 1, further comprising:
   for each of the at least one non-volatile memory cell a second switch, which is configured selectively to disconnect the at least one non-volatile memory cell from the write circuit and/or from the read circuit for the test operating mode, or to connect the at least one non-volatile memory cell to the write circuit and/or to the read circuit.

5. The memory device as claimed in claim 1, further comprising:
   at least one buffer memory, which is configured to buffer a data value for storing in the at least one non-volatile memory cell.

6. The memory device as claimed in claim 5, further comprising:
   at least one sense amplifier, which has a sense-amplifier input connected to the at least one non-volatile memory cell, and is configured to determine an output value based on an electrical signal received at the sense-amplifier input, and to provide said output value at a sense-amplifier output.

7. The memory device as claimed in claim 6,
   wherein the at least one buffer memory is coupled to the at least one sense amplifier.

8. The memory device as claimed in claim 6,
   wherein the at least one buffer memory is further configured, in the test operating mode, to buffer the data value, and to control according to the buffered data value the electrical signal received at the sense-amplifier input.

9. The memory device as claimed in claim 6,
   wherein the at least one sense amplifier is configured to convert the electrical signal received at the sense-amplifier input into a corresponding time signal by switching over the output value from a first value to a second value when an integrated value of the electrical signal reaches a predefined threshold value.

10. The memory device as claimed in claim 6, further comprising:
an evaluation circuit, which is configured to determine at least one logic value based on the output value provided at the sense-amplifier output.

11. The memory device as claimed in claim 1,
wherein the at least one non-volatile memory cell is a resistive memory cell.

12. The memory device as claimed in claim 1,
wherein the at least one non-volatile memory cell comprises, or consists of, one from the following group:
RRAM;
PCRAM;
MRAM; and
FLASH.

13. A memory device comprising:
at least one non-volatile memory cell;
a write circuit configured to write to the at least one non-volatile memory cell;
a read circuit configured to read from the at least one non-volatile memory cell;
wherein the memory device is configured to be operable in a test operating mode, in which at least one test path can be tested, and
wherein the at least one test path comprises at least a portion of the write circuit and at least a portion of the read circuit, and bypasses the at least one non-volatile memory cell;
at least one buffer memory, which is configured to buffer a data value for storing in the at least one non-volatile memory cell;
at least one sense amplifier, which has a sense-amplifier input connected to the at least one non-volatile memory cell, and is configured to determine an output value based on an electrical signal received at the sense-amplifier input, and to provide said output value at a sense-amplifier output;
an evaluation circuit, which is configured to determine at least one logic value based on the output value provided at the sense-amplifier output; and
wherein the at least one buffer memory comprises a plurality of buffer memories, wherein in a predefined first number of the plurality of buffer memories is stored a first data value, and in a predefined second number of the plurality of buffer memories is stored a second data value,
wherein the at least one sense amplifier comprises a plurality of sense amplifiers, wherein the evaluation circuit is further configured to determine the predefined first number of the plurality of buffer memories having output values being the first to have switched over to the second data value, and to identify the buffer memories having output values that have not yet switched over to the second data value as belonging to the predefined second number of the plurality of buffer memories.

14. The memory device as claimed in claim 13,
wherein the at least one logic value comprises a plurality of different logic values, and
wherein the evaluation circuit is further configured to assign one of the plurality of different logic values to each possible combination of the predefined first number of second values and the predefined second number of first values.

* * * * *